United States Patent
Singh et al.

[19]

[11] Patent Number: 5,831,288
[45] Date of Patent: *Nov. 3, 1998

[54] SILICON CARBIDE METAL-INSULATOR SEMICONDUCTOR FIELD EFFECT TRANSISTOR

[75] Inventors: Ranbir Singh, Cary; John W. Palmour, Raleigh, both of N.C.

[73] Assignee: Cree Research, Inc., Durham, N.C.

[*] Notice: The term of this patent shall not extend beyond the expiration date of Pat. No. 5,719,409.

[21] Appl. No.: 939,710

[22] Filed: Sep. 29, 1997

Related U.S. Application Data

[63] Continuation of Ser. No. 659,412, Jun. 6, 1996, Pat. No. 5,719,409.

[51] Int. Cl.[6] .............................................. H01L 31/0312
[52] U.S. Cl. ............................................. 257/77; 257/330
[58] Field of Search ...................... 257/76, 77, 327–334

[56] References Cited

U.S. PATENT DOCUMENTS

| | | |
|---|---|---|
| 4,219,835 | 8/1980 | van Loon . |
| 4,571,815 | 2/1986 | Baliga et al. . |
| 4,587,712 | 5/1986 | Baliga . |

(List continued on next page.)

FOREIGN PATENT DOCUMENTS

| | | | |
|---|---|---|---|
| 0518683 A1 | 12/1992 | European Pat. Off. . | |
| 0580452 | 1/1994 | European Pat. Off. . | |
| 196 29 088 A1 | 1/1997 | Germany | H01L 29/78 |
| 63-136568 | 11/1986 | Japan . | |
| 63-047983 | 2/1988 | Japan . | |
| 63-278276 | 11/1988 | Japan . | |
| 4029368 | 1/1992 | Japan . | |
| 0082792 | 4/1993 | Japan . | |
| 2 269 050 | 1/1994 | United Kingdom | H01L 29/06 |

| | | |
|---|---|---|
| WO89/04056 | 5/1989 | WIPO . |
| WO93/26047 | 12/1993 | WIPO . |

OTHER PUBLICATIONS

Williams, et al., A 30–V P–channel Tench Gated DMOSFET with 900 $\mu\Omega$–cm$^2$ Specific On–Resistance at 2.7 V, Proceedings of the 8$^{th}$ International Symposium on Power Semiconductor Devices and IC's ISPSD), pp. 53–56 (1996).

Internatonal Search Report.

Saidov, M. S., Shamuratov, Kh. A. and Umurzakov, A; Current–voltage characteristics of silicon carbide heterojunctions, *Sov. Phys. Semicond.* 13(9), pp. 1054–1056 (Sep. 1979).

Kong et al., *Temperature dependence of the current–voltage characteristics of metal–semiconductor field–effect transistors in n–type $\beta$–SiC grown via chemical vapor deposition,* Appl. Phys. Lett. 51(6), 10 (Aug. 1987).

(List continued on next page.)

*Primary Examiner*—David B. Hardy
*Attorney, Agent, or Firm*—Myes Bigel Sibley & Sajovec

[57] ABSTRACT

A silicon carbide (SiC) metal-insulator semiconductor field effect transistor having a u-shaped gate trench and an n-type SiC drift layer is provided. A p-type region is formed in the SiC drift layer and extends below the bottom of the u-shaped gate trench to prevent field crowding at the corner of the gate trench. A unit cell of a metal-insulator semiconductor transistor is provided having a bulk single crystal SiC substrate of n-type conductivity SiC, a first epitaxial layer of n-type SiC and a second epitaxial layer of p-type SiC. First and second trenches extend downward through the second epitaxial layer and into the first epitaxial layer with a region of n-type SiC between the trenches. An insulator layer is formed in the first trench with the upper surface of the insulator on the bottom of the trench below the second epitaxial layer. A region of p-type SiC is formed in the first epitaxial layer below the second trench. Gate and source contacts are formed in the first and second trenches respectively and a drain contact is formed on the substrate.

13 Claims, 9 Drawing Sheets

U.S. PATENT DOCUMENTS

| | | |
|---|---|---|
| 4,608,584 | 8/1986 | Mihara . |
| 4,642,666 | 2/1987 | Lodow et al. . |
| 4,757,028 | 7/1988 | Kondoh et al. . |
| 4,762,806 | 8/1988 | Suzuki et al. . |
| 4,860,084 | 8/1989 | Shibeta . |
| 4,865,685 | 9/1989 | Palmour . |
| 4,893,160 | 1/1990 | Blanchard . |
| 4,897,710 | 1/1990 | Suzuki et al. . |
| 4,908,682 | 3/1990 | Takahashi . |
| 4,912,063 | 3/1990 | Davis et al. . |
| 4,912,064 | 3/1990 | Kong et al. . |
| 4,952,991 | 8/1990 | Kayama . |
| 4,959,699 | 9/1990 | Lidow et al. . |
| 4,965,647 | 10/1990 | Takahashi . |
| 4,972,240 | 11/1990 | Murakami et al. . |
| 4,974,059 | 11/1990 | Kinzer . |
| 4,975,750 | 12/1990 | Hayashi et al. . |
| 4,981,551 | 1/1991 | Palmour . |
| 4,994,413 | 2/1991 | Eshita . |
| 5,072,266 | 12/1991 | Bulucea et al. ........................ 357/23.4 |
| 5,168,331 | 12/1992 | Yilmaz . |
| 5,170,231 | 12/1992 | Fujii et al. . |
| 5,177,572 | 1/1993 | Murakami .............................. 257/260 |
| 5,225,032 | 7/1993 | Golecki . |
| 5,230,768 | 7/1993 | Furukawa et al. . |
| 5,233,215 | 8/1993 | Baliga . |
| 5,247,192 | 9/1993 | Nii . |
| 5,264,713 | 11/1993 | Palmour . |
| 5,270,554 | 12/1993 | Palmour . |
| 5,279,701 | 1/1994 | Shigeta etal. . |
| 5,323,040 | 6/1994 | Baliga . |
| 5,396,085 | 3/1995 | Baliga . |
| 5,471,075 | 11/1995 | Shekar et al. ........................... 257/139 |
| 5,506,421 | 4/1996 | Palmour ................................... 257/77 |

OTHER PUBLICATIONS

Kelner et al., β–SiC MESFET's and Buried–Gate JFET's, *IEEE Electron Device Letters* vol. EDL–8, No. 9 (Sep. 1987).

Palmour et al., High–temperature depletion–mode metal–oxide–semiconductor field–effect transistos in beta–SiC thin films, *320 Applied Physics Letters,* 51 (Oct. 1987).

Dmitriev et al., High–temperature Sic–6H Field–effect Transistor with p–n gate, *Sov. Tech. Phys. Lett.* 14(2) (Feb. 1988).

Edmond, J.A., RYU, J., Glass, J. T. and Davis, R.F.; Electrical Contacts to Beta Silicon Carbide Thin Films, *Journal of the Electrochemical Society 135*(2) (Feb. 1988).

Dimitriev et al., First SiC Dynistor, *Electronics Letters,* vol. 24, No. 16 (Aug. 1988).

Palmour et al., Characterization of device parameters in high–temperature metal–oxide–semiconductor/field–effect transistors in β–SiC thin films, *J. Appl. Phys.* 64(4) (Aug. 15, 1988).

Fuma et al., High Temperature Operated Enhancement–Type β–SiC MOSFET, *Japanese Journal of Applied Physics,* vol. 27, No. 11 (Nov. 1988).

Yoder et al., Silicon Carbide Comes of Age, *Naval Research Revies* (1989).

Kelner et al., High–Transconductance β–SiC Buried–Gate JFET's *IEEE Transactions On Electron Devices,* vol. 36, No. 6 (Jun. 1989).

Palmour, et al., Ultrafast silicon carbide rectifiers, *Powertechnics Magazine* (Aug. 1989).

Pan et al., Reactive Ion Etching of SiC Thin Films By Mixtures of Flourinated Gases and Oxygen, *Journal of the Electrochemical Society,* 137, No. 1 (Jan. 1990).

Waldrop et al., Formation of /Schottky barrier height of metal contacts to β–SiC, *Appl. Phys. Lett.* 56(6) (Feb. 5, 1990).

Kanaya et al., Controlled sublination growth of single crystalline 4H–SiC and 6H–SiC and identification of polytypes by x–ray diffraction, *Appl. Phys. Lettl.,* vol. 58, No. 1 (Jan. 7, 1991).

Kelner et al., High Temerperature Operation of α–Silicon Carbide Buried–Gate Junction Field Effect Transistors, *Elec. Lett.,* vol. 27, no. 12 (Jun. 1991).

Palmour et al., Junction Devices in 6H–SiC, *International Semiconductor Device Research Symposium* (Dec. 4–6, 1991).

Baliga, New Materials Beyond Silicon For Power Devices, *Power Semiconductor Devices and Circuits* (1992).

Ivanov et al., Recent Developments in SiC Single–Crystal Electronics, *Semicondutor Science and Technology,* No. 7 (Jul. 1992).

Bhatnagar et al., SiC power UMOSFET: design, analysis and technological feasibility, *Inst. Phys. Conf.* No. 137, Ch. 7 (1993).

Alok et al., Low Contact Resistivity Ohmic Contacts to 6H–Silicon Carbide, *IEEE* (1993).

Bhatnagar et al., *Comparison of 6H–SiC, 3C–SiC, and Si for Power Devices,* (1993).

Baliga, Power MOSFET, *Power Semiconductor Devices,* Ch. 7, pp. 335–425.

SILICON CARBIDE METAL-INSULATOR SEMICONDUCTOR FIELD EFFECT TRANSISTOR

This application is a continuation of application Ser. No. 08/659,412, filed Jun. 6, 1996 now U.S. Pat. No. 5,719,409.

FIELD OF THE INVENTION

The present invention relates to metal-insulator semiconductor devices and more particularly to such devices formed in silicon carbide. The present invention particularly relates to metal-oxide semiconductor devices.

BACKGROUND OF THE INVENTION

As demands for higher speed, higher power devices increases, the need for devices having faster switching speeds, higher current carrying capability and increased forward blocking breakdown voltages has also increased. Applications such as power modules for motor and generator control, electronic ballasts for lighting control, industrial robots, display drivers, automotive ignition and automation control would all benefit from higher power, higher speed transistors. Unfortunately, limitations in break-down voltage have reduced the usefulness of presently available silicon metal-oxide field-effect transistors.

Figure 1:
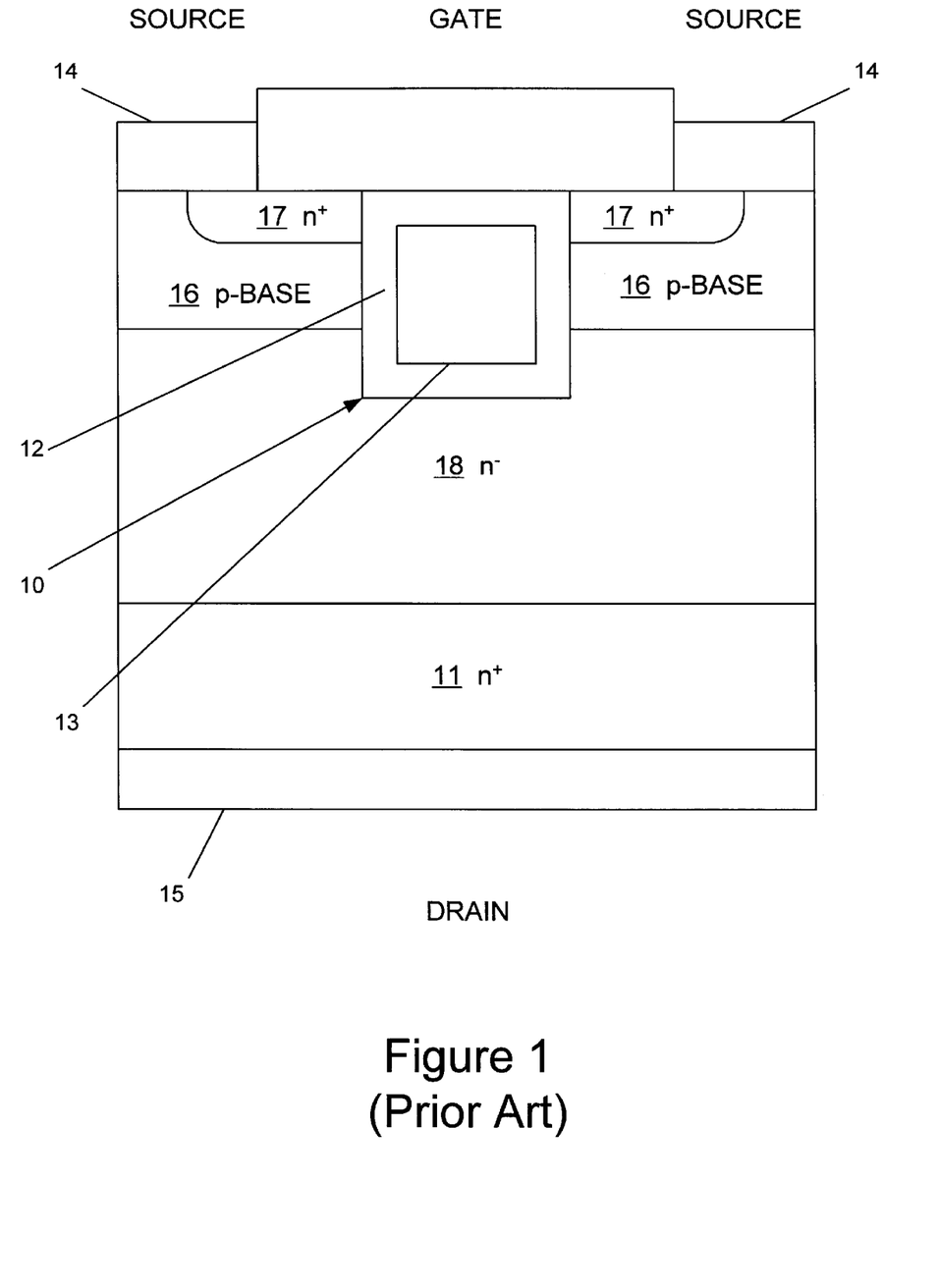
FIG. 1 is a cross-sectional view of a UMOSFET.

One device which is useful in high voltage and high power applications is a device which is known as a UMOSFET. As seen in FIG. 1, a UMOSFET is a metal-oxide semiconductor field effect transistor where the gate is formed in a U shaped groove. In the UMOSFET a gate groove is formed with an oxide layer 12 formed in the groove. A gate material 13, such as doped polysilicon, is then formed on the oxide layer in the groove to create a gate contact. The UMOSFET also has a source contact 14 and a drain contact 15. A p-type base region 16 separates an n+ source region 17 from an n-type drift region 18. In the on state of operation, a conductive path is formed between the n+ source region 17 and the n drift region 18. This conductive path results from an inversion layer formed in the base region 16 along the sidewall of the gate groove when a positive voltage is applied to the gate. The formation of an inversion layer results in current flow from the drain 15 through an n+ substrate 11, the n drift region 18 and the p base layer 16 to the n+ region 17 and the source 14. A UMOSFET formed in silicon carbide is described in U.S. Pat. No. 5,506,421.

The off state or the "forward blocking mode" of the UMOSFET occurs when the gate to source voltage is reduced to below the threshold voltage of the MOSFET. In the forward blocking mode no inversion layer is formed in the channel and an increased drain to source voltage is supported by the device. Because the gate groove extends past the edge of the p base/n drift region junction, a high electric field can occur at the corner of the gate groove 10. This increase in electric field at the corner of the groove 10 is known as "field crowding" and results in a disproportionate amount of the blocking voltage being supported by the corner region of the gate groove. Accordingly, breakdown at the corner 10 can occur prior to breakdown in the bulk of the semiconductor because of oxide breakdown in this high field region. Thus, in the case of a UMOSFET the breakdown voltage in the forward blocking mode may be less than the bulk semiconductor breakdown voltage because of the structural characteristics of the device. This is highly undesireable as it derates the designed forward blocking voltage of the device and introduces unpredictability in the breakdown voltage capability of the device.

OBJECT AND SUMMARY OF THE INVENTION

In view of the foregoing, it is one object of the present invention to provide a MOSFET having a forward blocking mode breakdown voltage which more closely approximates the bulk semiconductor breakdown voltage. An additional object of the present invention is to provide a MOSFET with reduced on-state resistance and increased forward blocking mode breakdown voltage. It is a further object of the present invention to provide such a device which is capable of being manufactured utilizing silicon carbide.

The present invention provides a silicon carbide metal-insulator semiconductor field effect transistor having increased forward blocking mode breakdown voltage. An increased forward blocking mode breakdown voltage is provided in a silicon carbide metal-insulator semiconductor field effect transistor having a u-shaped gate trench and an n-type silicon carbide drift layer. A p-type region is formed in the silicon carbide drift layer and extends below the bottom of the u-shaped gate trench so as to prevent field crowding at the corner of the gate trench. Such a transistor also has a p-type silicon carbide base layer formed on the silicon carbide drift layer. The p-type silicon carbide base layer has its carrier concentration and/or its thickness selected to reduce the on-state resistance of the transistor while preventing back depletion of the base layer. In a particular embodiment of the present invention, the p-type silicon carbide base layer has a thickness which is sufficient to prevent back depletion of the base layer under high forward blocking voltages and which is less than the thickness required to prevent back depletion in a corresponding silicon carbide field effect transistor which does not have the p-type silicon carbide regions formed in its silicon carbide drift layer.

In a further embodiment of the present invention, a transistor is provided by a unit cell of a metal-insulator semiconductor transistor having a bulk single crystal silicon carbide substrate of n-type conductivity silicon carbide. A first epitaxial layer of n-type conductivity silicon carbide is formed on the upper surface of the substrate. Furthermore, the carrier concentration of the substrate is higher than the carrier concentration of the first epitaxial layer. A second epitaxial layer of p-type conductivity silicon carbide is formed on the first epitaxial layer.

A first trench is formed which extends downward through the second epitaxial layer and into the first epitaxial layer. A second trench, adjacent the first trench, is also formed extending downward through the second epitaxial layer and into the first epitaxial layer. Regions of n-type conductivity are formed between the first trench and the second trench and adjacent the second epitaxial layer. The n-type conductivity regions have a higher carrier concentration than the first and second epitaxial layers. The n-type regions also have an upper surface opposite the second epitaxial layer. These n-type regions may be either implanted or may be a third epitaxial layer formed on the second epitaxial layer.

An insulator layer, preferably silicon dioxide, is formed on the sidewalls and the bottom of the first trench and extends onto the upper surface of the n-type conductivity regions between the first and the second trench to create a gate insulator layer. The upper surface of the gate insulator layer formed on the bottom of the first trench is below the lower surface of the second epitaxial layer. Also a region of p-type conductivity silicon carbide is formed in the first epitaxial layer below the second trench. This region of p-type conductivity silicon carbide has a higher carrier concentration than the second epitaxial layer.

Ohmic contacts are formed on the lower surface of the substrate to form a drain contact and on the sidewall and the bottom of the second trench and extending onto the upper surface of the n-type conductivity regions between the first and the second trench to form a source contact. A conductive layer is also formed in the first trench to form a gate contact.

Such a transistor exhibits many advantages over previous silicon carbide transistors. These advantages include an increase in forward blocking mode breakdown voltage as a result of reduced field crowding at the corner of the gate oxide. This reduction in field crowding results from the p-n junction sharing a greater portion of the depletion region, and, therefore, the electric field, than the oxide-n junction. The reduction in field crowding is particularly important with respect to silicon carbide devices which can operate at higher temperatures and higher voltages because gate oxide is more susceptible to failure at higher temperatures.

Furthermore, because the source contact has a larger contact area to the p-type gate layer and a better ohmic contact is formed to both the gate layer and the p-type implanted regions, it is expected that a transistor according to the present invention will exhibit a highly stable threshold voltage. As a result of these features, a reduced gain in the parasitic NPN transistor of the device is expected. These characteristics should result in a highly reliable MOSFET at all operating temperatures. The source contact formed in the source trench also results in increased area of source metal contact which may provide lower on-state resistance for the device.

Also, as a result of the introduction of the p-type implanted regions, back depletion of the p-type base layer may be prevented with a lower p-type epitaxial layer doping or, perhaps more importantly, a thinner p-type base layer may be formed for a given forward blocking voltage. The lower doping and/or the thinner base layer results in a lower threshold voltage of the device and a lower on-state resistance during forward conduction. This lower on-state resistance results because the primary component of resistance is currently the high inversion layer resistance (low channel mobility). By decreasing the thickness of the epitaxial layer this resistance is correspondingly reduced. Alternatively, by decreasing the doping a strong inversion under the gate of the MOS structure is possible.

In an alternative embodiment the unit cell of the metal oxide semiconductor transistor does not have the second trench. Instead, a p-type conductivity region is formed in the first epitaxial layer before growth of the second epitaxial layer. In this embodiment the n-type conductivity regions are implanted regions of n-type conductivity silicon carbide formed in the p-type conductivity second epitaxial layer. These implanted regions of n-type conductivity are formed so as to allow a contact between the p-type epitaxial layer and the source contact to prevent drift of the p-type epitaxial layer.

The advantage of this alternative structure is that unit cells may be more closely packed because the cells do not require two trenches to be formed. Thus, the fabrication limitations of etching two trenches adjacent each other are not the limiting constraint on the spacing of the unit cells. Furthermore, if unit cells are more closely spaced the size of the p-type implanted region in the first epitaxial layer may be reduced. Because this p-type region does not contribute to the on-state operation of the device but only functions in the forward blocking mode, reduction in its size is desirable.

While attempts have been made in silicon devices to reduce the field crowding which occurs at the corner of the gate trench, these techniques may not be utilized in silicon carbide because of fabrication limitations. For example, one such attempt in a silicon device is shown in U.S. Pat. No. 5,072,266 issued to Bulucea et al. reference describes implanting in the central portion of a substantially planar silicon p layer a $p^+$ shaped deep body junction which partly lies below the trench bottom and lies between two gate trenches. This deep level implant is formed by deep level ion implantation. However, the techniques of the Bulucea et al. reference are inoperable for use in silicon carbide because of the difficulty in diffusing to deep levels in silicon carbide. However, as discussed above, the present invention creates a silicon carbide field effect transistor with increased forward blocking mode breakdown voltage despite the limitation of silicon carbide fabrication techniques.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
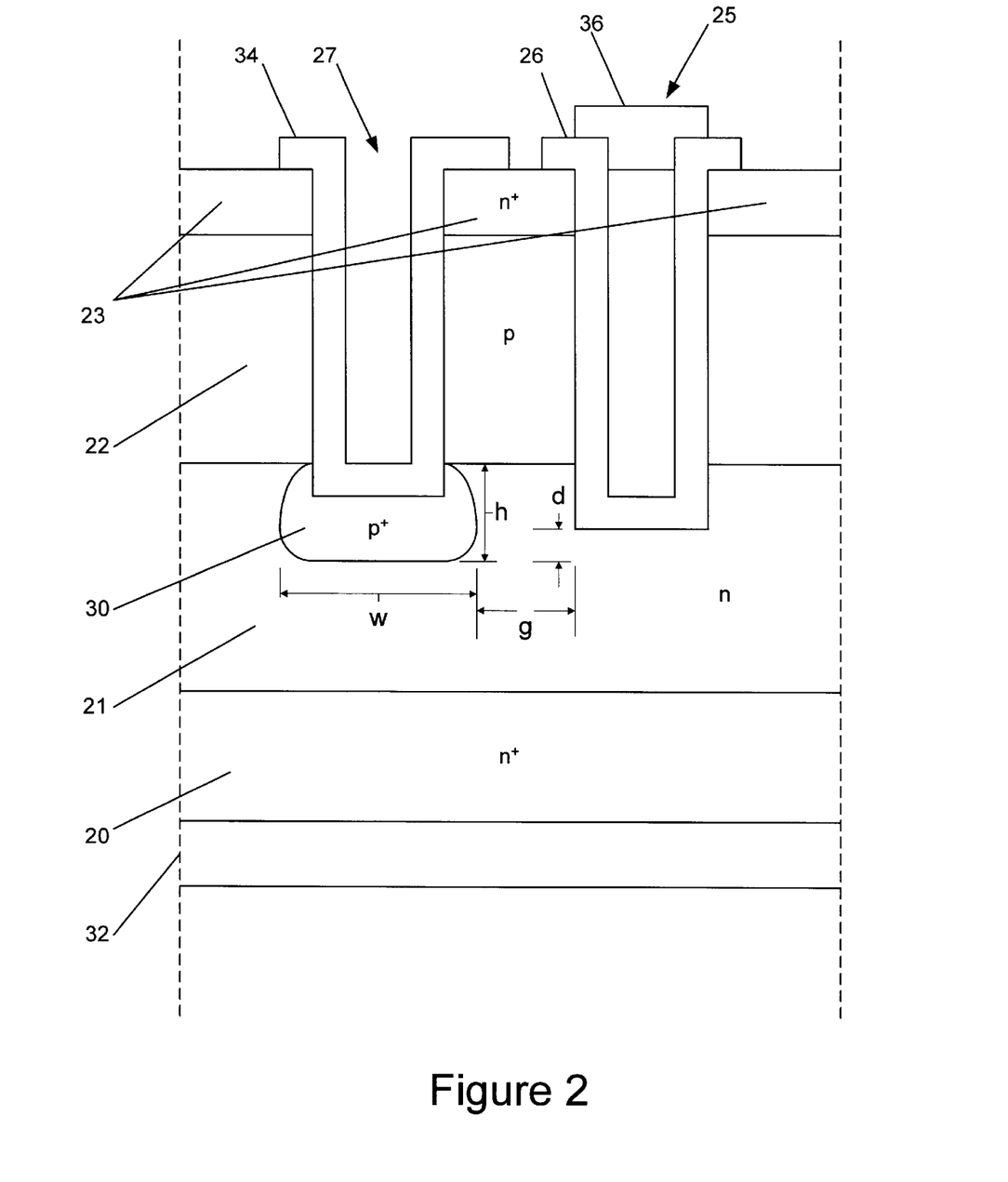
FIG. 2 is a cross sectional view of a unit cell of a FET according to the present invention.

FIG. 2 illustrates one embodiment of the present invention. As seen in FIG. 2, a unit cell of a metal insulator semiconductor transistor is illustrated having a bulk single crystal silicon carbide substrate 20 of n-type conductivity silicon carbide. The substrate 20 has an upper surface and a lower surface opposite the upper surface. A first epitaxial layer 21 of n-type conductivity silicon carbide is formed on the upper surface of the substrate 20. The carrier concentration of the substrate 20 is higher than the carrier concentration of the first epitaxial layer. Thus, the substrate may be referred to as an n⁺ substrate. Additionally, an n-type silicon carbide buffer layer may be added between the substrate and the first epitaxial layer. This, optional n⁺ layer is reflected in FIG. 2A as layer 24.

Formed on the first epitaxial layer 21 is a second epitaxial layer 22. The second epitaxial layer 22 is a p-type conductivity silicon carbide. Formed on the second epitaxial layer 22 are regions 23 of n⁺ conductivity silicon carbide. These regions 23 may be formed as a third epitaxial layer or may be formed utilizing ion implantation into the second epitaxial layer 22. However the regions 23 are formed, they should be formed at least between the gate trench 25 and the source trench 27 but may extend over the entire surface of the second epitaxial layer 22 as shown in FIGS. 2 and 2A.

Figure 2A:
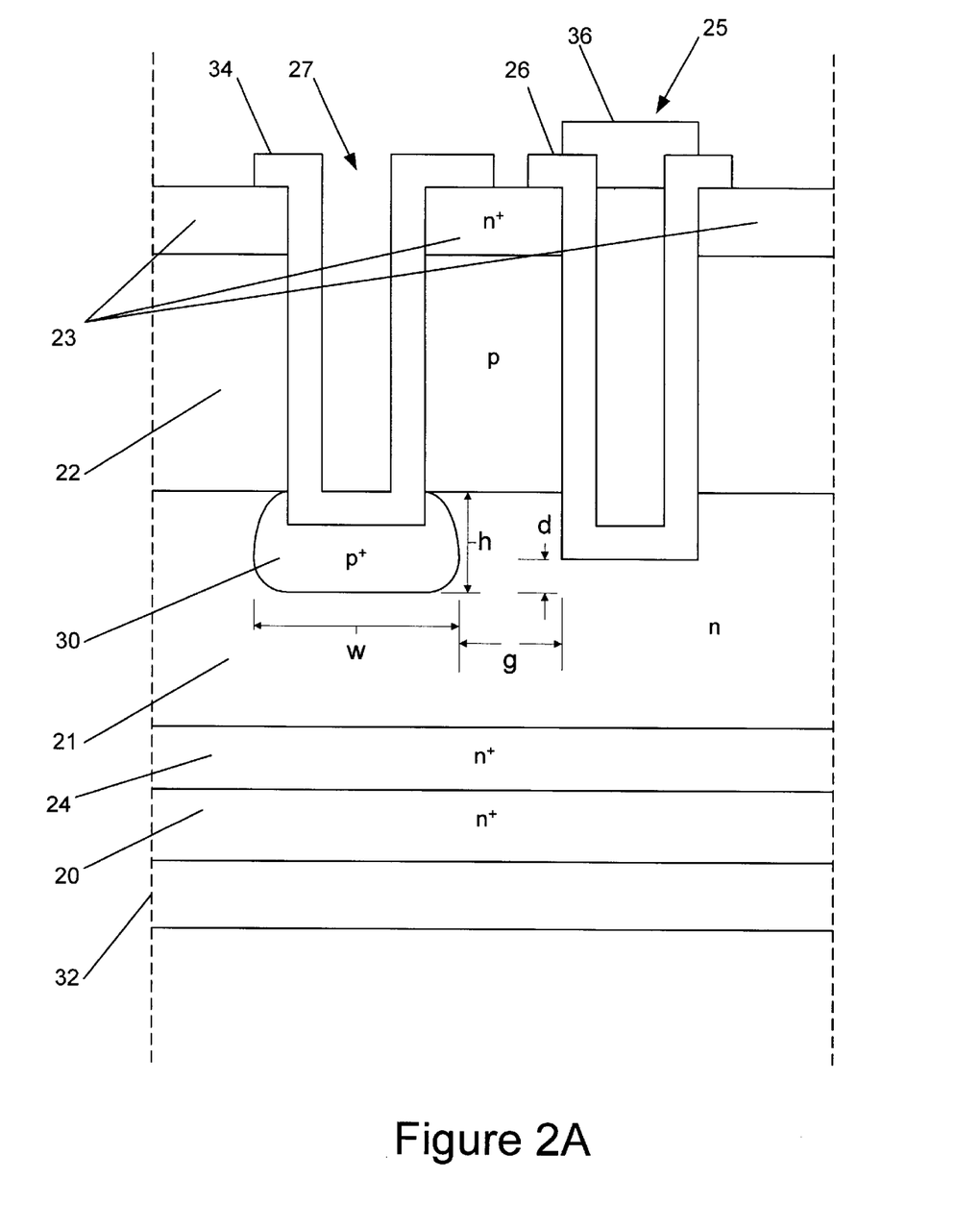
FIG. 2A is a cross sectional view of an alternative embodiment of a unit cell of a FET according to the present invention.

The unit cell illustrated in FIGS. 2 and 2A also includes a gate trench 25. The gate trench 25 is formed by forming a trench which extends downward through the n⁺ regions 23 and the second epitaxial layer 22 and into the first epitaxial layer 21. Thus the gate trench 25 has sidewalls and a bottom. An insulator layer 26, preferably an oxide layer, is formed on the sidewalls and bottom of the gate trench and extends onto the upper surface of the n⁺ regions 23. This insulator layer 26 is preferably an oxide layer such as silicon dioxide, but may also be made of other materials such as silicon nitride, aluminum nitride or other insulator materials known to those of skill in the art. The width and depth of the gate trench 25 is dependent upon the desired electrical properties of the device. Widths of from about 0.1 μm to about 50 μm may be utilized for the present invention. The depth of the gate trench must be sufficiently deep such that the upper surface of the insulator/oxide layer 26 formed on the bottom of the gate trench 25 is below the interface between the second epitaxial layer 22 and the first epitaxial layer 21.

A second trench is also formed in the unit cell of FIG. 2. This source trench 27 is adjacent to the gate trench 25 and extends downward through the n⁺ regions 23 and the second epitaxial layer 22 and into the first epitaxial layer 21. The width and depth of the source trench 27 is also dependent upon the characteristics of the device. Widths of from about 0.1 μm to about 50 μm may be utilized with the present invention. Furthermore, the depth of the source trench 27 should be sufficiently deep so as to allow for proper placement of a p⁺ region 30 formed in the first epitaxial layer 21 and adjacent to the lower corner of the trench 25 so as to prevent field crowding when the transistor is operating in the forward blocking mode.

As briefly discussed above, the unit cell of FIGS. 2 and 2A also includes a region of p-type conductivity silicon carbide 30 formed in the first epitaxial layer 21 below the source trench 27. This region of p-type conductivity silicon carbide 30 has a higher carrier concentration than the second epitaxial layer 22. As shown in FIGS. 2 and 2A, the region of p-type conductivity silicon carbide 30 extends below the bottom of the gate trench 25.

An ohmic contact is formed on the lower surface of the substrate 20 to create a drain contact 32. An ohmic contact is also formed on the sidewalls and bottom of the source trench 27 and extends onto the upper surface of the n⁺ regions 23 between the source trench 27 and the gate trench 25. This ohmic contact formed in the source trench 27 provides a source contact 34 for the unit cell of FIGS. 2 and 2A. A conductive layer is also formed on the insulator layer 26 in the gate trench 25 to provide a gate contact 36.

Figure 3:
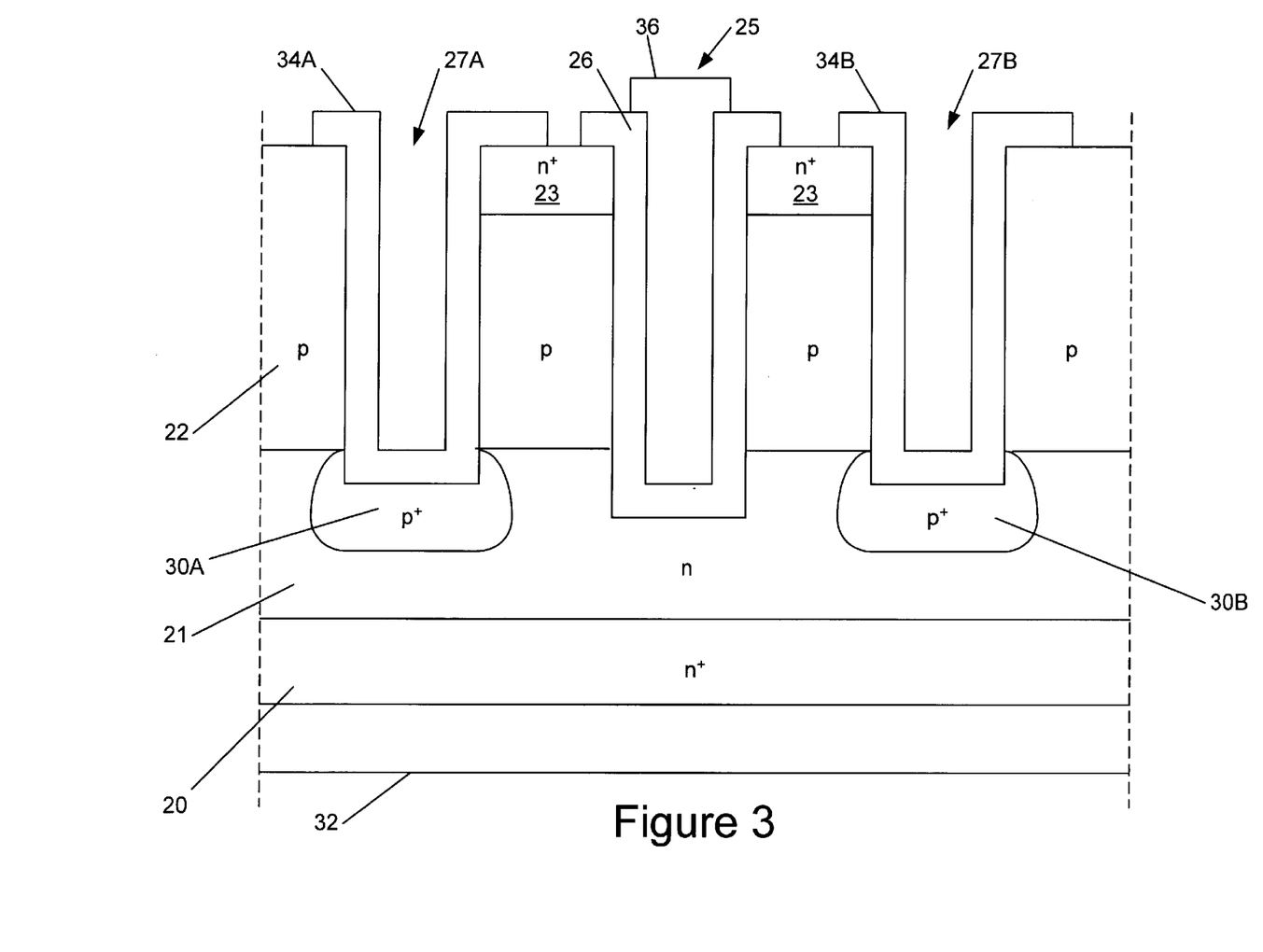
FIG. 3 is a cross sectional view of a FET according to the present invention.

FIG. 3 illustrates one embodiment of the present invention formed as a single metal oxide semiconductor field effect transistor. FIG. 3 represents 1.5 times the unit cell of FIG. 2 or FIG. 2A which is used to fabricate the entire device. As seen in FIG. 3, the transistor includes the substrate 20, first epitaxial layer 21, second epitaxial layer 22, and n⁺ regions 23 of FIG. 2 or 2A. The transistor of FIG. 3 however, includes a second source trench 27B adjacent to the gate 25. Thus, two source trenches 27A and 27B surround the gate trench 25. In addition to having two source trenches 27A and 27B, the transistor of FIG. 3 includes two p-type conductivity regions 30A and 30B formed at the bottoms of trenches 27A and 27B. Thus, regions 30A and 30B are formed in the first epitaxial layer 21. The p-type conductivity regions 30A and 30B extend past the bottom of the gate trench 25.

The transistor of FIG. 3 also includes ohmic contacts formed in source trenches 27A and 27B. The ohmic contact 34A formed in trench 27A is electrically connected to the ohmic contact 34B formed in trench 27B. Both ohmic contacts 34A and 34B are in contact with the sidewalls and bottom of trenches 27A and 27B and extend onto the upper surface of the n⁺ regions 23 and extend toward the gate trench 25.

Figure 4:
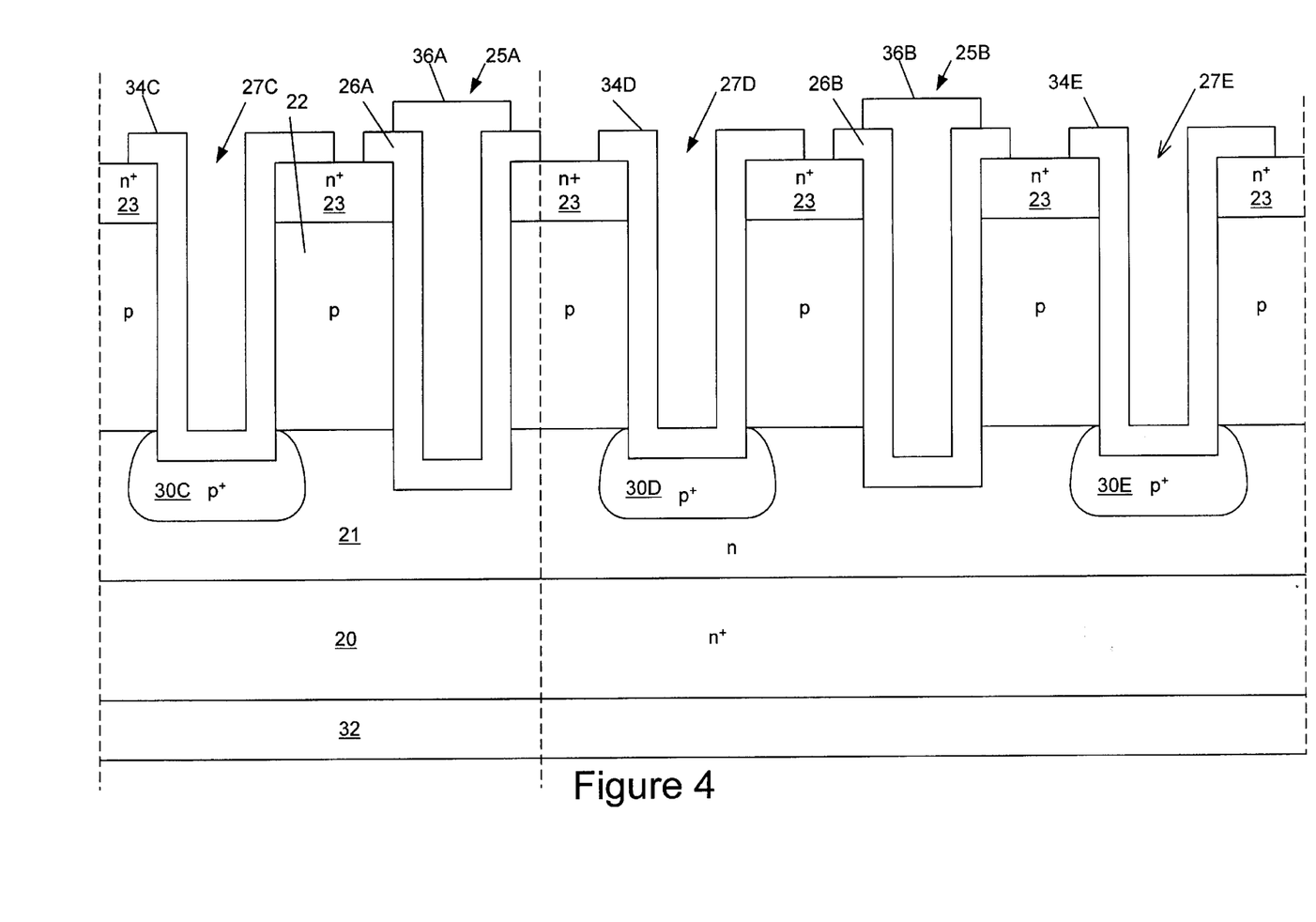
FIG. 4 is a cross sectional view of a FET utilizing the unit cells of FIG. 2.

FIG. 4 illustrates a transistor according to the present invention having a plurality of unit cells of FIG. 2 or 2A. The transistor of FIG. 4 is comprised of two unit cells and a terminating source trench. As seen in FIG. 4, a plurality of gate trenches 25A and 25B are formed. Adjacent to these trenches are a plurality of source trenches 27C, 27D, and 27E. The source trench 27E acts as a pattern terminating trench so that the gate trench 25B is surrounded by source trenches 27D and 27E. As will be appreciated by one of skill in the art, any number of unit cells of FIG. 2 or 2A may be combined to create a transistor according to the present invention. However, it is preferred that each of the gate trenches have a source trench on both sides of the gate trench so that the p-type conductivity regions formed in the first epitaxial layer 21, illustrated in FIG. 4 as 30C, 30D, and 30E, may be formed on both sides of the gate trenches.

The transistor of FIG. 4 also includes a plurality of p-type conductivity regions formed at the bottom of the source trenches 27C, 27D, and 27E to create regions 30C, 30D, and 30E in the first epitaxial layer 21. Also formed in source trenches 27C, 27D, and 27E are ohmic contacts 34C, 34D, and 34E. The source contacts 34C, 34D, and 34E are electrically connected. Likewise, gate contacts 36A and 36B are formed in gate trenches 25A and 25B and are electrically connected. The drain contact 32 is formed on the lower surface of substrate 20 as described with respect to the unit cell of FIG. 2 or 2A and the transistor of FIG. 3.

Figure 5:
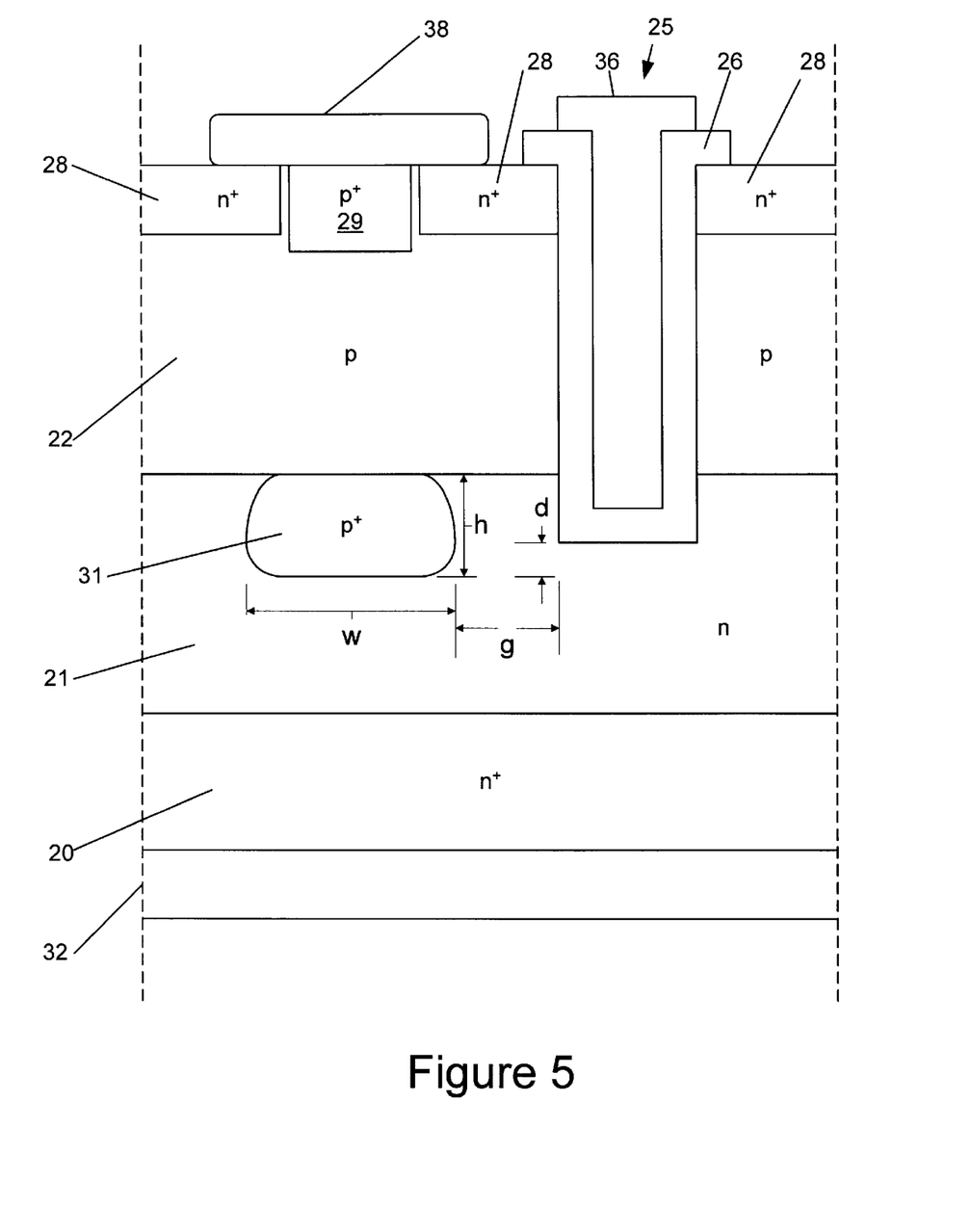
FIG. 5 is a cross sectional view of a unit cell of an alternative embodiment of the FET of the present invention.

FIG. 5 illustrates the unit cell of an alternate embodiment of the present invention. As seen in FIG. 5, a substrate 20 of n-type silicon carbide has an upper surface and a lower surface. The substrate 20 has a first epitaxial layer 21 of n-type conductivity silicon carbide formed on the upper surface of the substrate 20. The substrate 20 has a higher carrier concentration than the carrier concentration of the first epitaxial layer 21. A second epitaxial layer 22 of p-type conductivity silicon carbide is formed on the first epitaxial layer 21. Additionally, an n-type silicon carbide buffer layer may be added between the substrate and the first epitaxial layer. This, optional n⁺ layer is reflected in FIG. 5A as layer 24.

A gate trench 25 is formed by selectively etching through the second epitaxial layer 22 and into the first epitaxial layer 21. As with the unit cell of FIG. 2, the gate trench 25 has a width and depth selected based upon the electrical properties of the desired transistor. The gate trench 25, however, must extend to a depth sufficient to allow an insulator layer 26, preferably an oxide layer, to be formed on the sidewalls and bottom of the gate trench 25 such that the upper surface of the layer 26 formed in the bottom of gate trench 25 is below the interface between the second epitaxial layer 22 and the first epitaxial layer 21. As discussed above, the gate insulator is preferably silicon dioxide, thus making the present FET a MOSFET, however, other material may be utilized.

Regions of n-type conductivity silicon carbide 28 are formed in the second epitaxial layer 22 adjacent to the gate trench 25 and extend to the upper surface of the second epitaxial layer 22. The n-type conductivity silicon carbide region 28 are located such that an inversion layer formed in the p-type layer 22 next to the gate insulator 26 will connect the n-type conductivity silicon carbide region 28 to the n-type epitaxial layer 21. These regions of n-type conductivity silicon carbide 28 have a higher carrier concentration than is present in the first and second epitaxial layers 21 and 22.

Figure 5A:
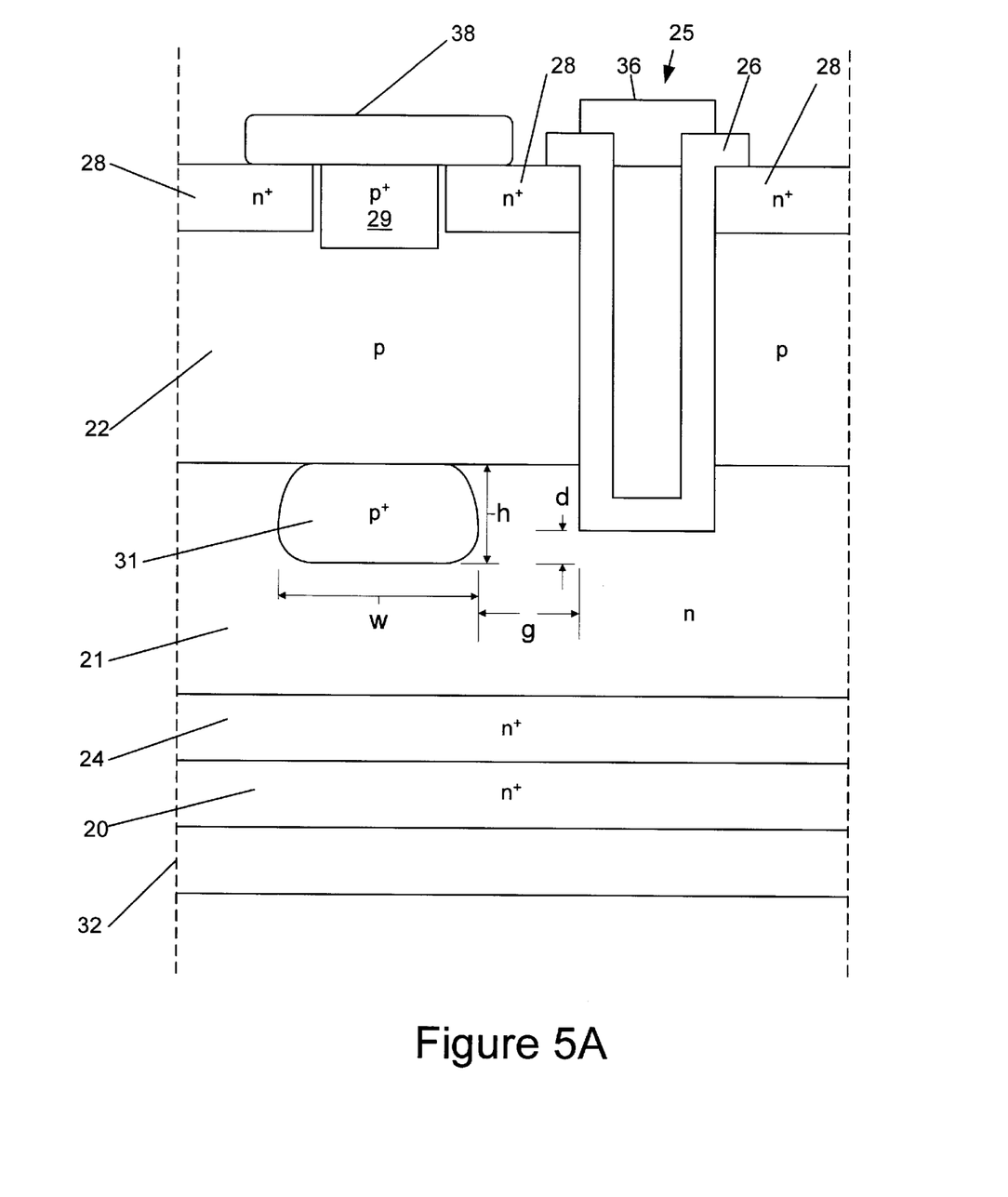
FIG. 5A is a cross sectional view of a unit cell of another alternative embodiment of the FET of the present invention.

As shown in FIGS. 5 and 5A, the gate insulator layer 26 which is formed in the gate trench 25 extends onto the upper surface of the second epitaxial layer 22 where the n-type conductivity regions 28 are formed. Thus, some portion of the gate insulator layer 26 extends over the n-type conductivity silicon carbide regions formed in the second epitaxial layer 22.

In addition to the gate insulator layer 26 coming in contact with the n-type regions 28, an ohmic source contact 38 is formed wherein the contact is formed on the upper surface of the second epitaxial layer 22 such that it is in contact with both the p-type conductivity silicon carbide of the second epitaxial layer 22 and the $n^+$ regions formed in the second epitaxial layer 22. As seen in FIG. 5 and FIG. 5A, an optional $p^+$ region 29 may be formed beneath the source contact 29 to improve the ohmic contact to the epitaxial layer 22. A gate contact 36 is formed inside the gate trench 25 and ohmic drain contact 32 is formed on the lower surface of substrate 20.

As seen in FIGS. 5 and 5A, a region of p-type conductivity silicon carbide 31 is formed in the first epitaxial layer 21 below the source contact 38. The region of p-type conductivity silicon carbide 31 has a higher carrier concentration than is present in the second epitaxial layer 22 and is formed adjacent the gate trench 25. The region of p-type conductivity silicon carbide 31 may be formed to extend below the bottom of the gate trench 25.

Figure 6:
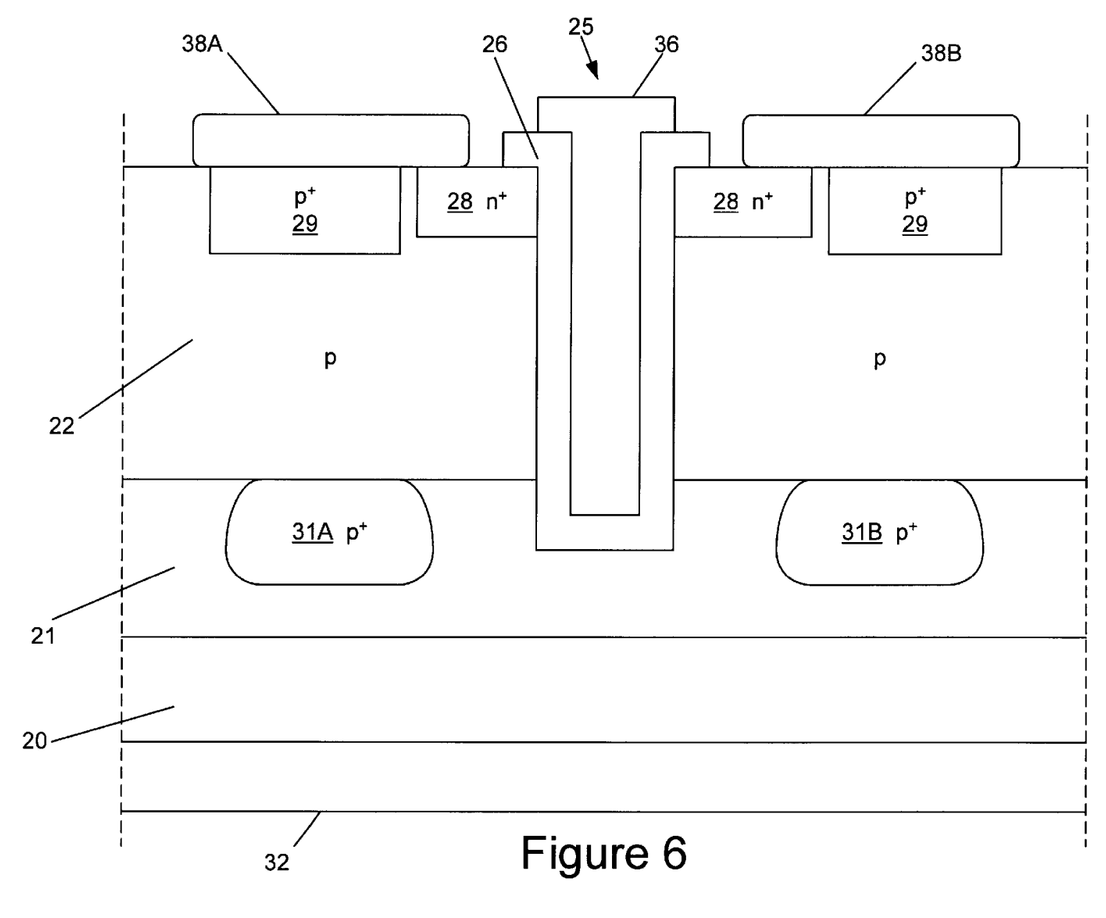
FIG. 6 is a cross sectional view of an alternative embodiment of a FET of the present invention.
Figure 7:
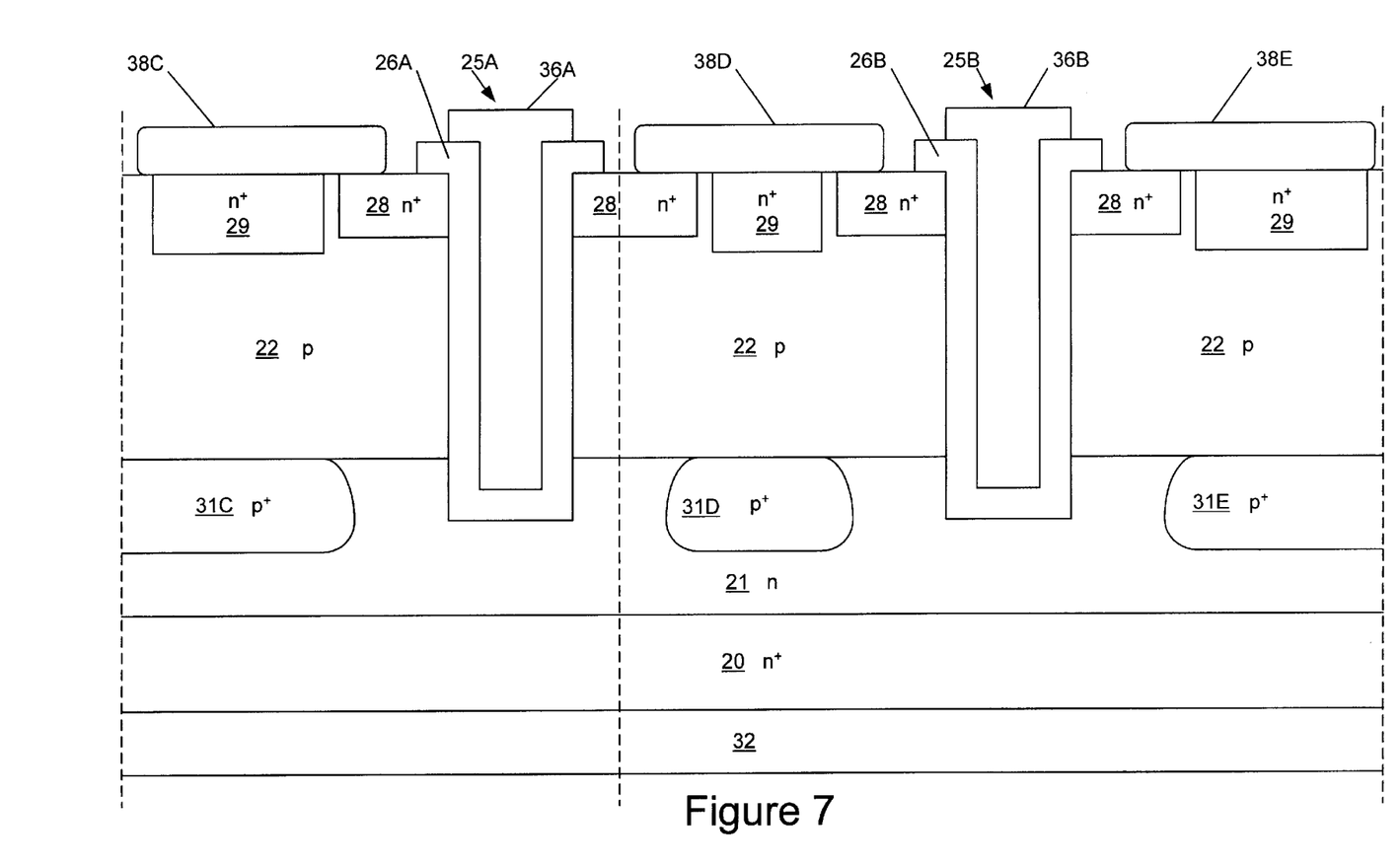
FIG. 7 is a cross sectional view of a FET utilizing the unit cell of FIG. 5.

As with the unit cell of FIGS. 2 and 2A, the unit cell of FIGS. 5 and 5A may also be incorporated in a single cell transistor such as shown in FIG. 6 or in a multi-cell transistor as shown in FIG. 7. The multi-cell transistor shown in FIG. 7 is comprised of a plurality of the unit cells of FIGS. 5 and 5A.

FIG. 6 illustrates a transistor according to the present invention having a single unit cell construction. As seen in FIG. 6, a bulk single crystal silicon carbide substrate 20 of n-type conductivity silicon carbide has an upper surface and a lower surface. A first epitaxial layer of n-type conductivity silicon carbide 21 is formed on the upper surface of the substrate 20 or the optional buffer layer 24. The substrate 20 has a higher carrier concentration than is present in the first epitaxial layer 21. A second epitaxial layer of p-type conductivity silicon carbide 22 is formed on the first epitaxial layer 21 and a trench 25 is formed through the second epitaxial layer 22 and into the first epitaxial layer 21. The trench 25 has sidewalls and a bottom which are covered by an insulator layer 26.

Regions of n-type conductivity silicon carbide 28 are formed in the second epitaxial layer 22. These regions begin at the upper surface of the second epitaxial layer 22 and extend downward into the epitaxial layer. The gate trench 25 is formed so that it is adjacent to the regions of n-type conductivity 28 such that an inversion layer formed in the p-type silicon carbide in contact with the gate insulator will connect the $n^+$ region 28 to the n-type epitaxial layer 21.

An insulator layer 26 is formed in the gate trench 25 and is formed on the sidewalls and the bottom of the trench and extends onto the upper surface of the second epitaxial layer 22 to come in contact with the n-type conductivity regions 28. The gate insulator layer 26 and the trench are formed such that the upper surface of the gate insulator layer 26 which is formed on the bottom of the trench 25 is below the interface between the first epitaxial layer 21 and the second epitaxial layer 22.

As seen in FIG. 6, regions of p-type conductivity silicon carbide 31A and 31B are formed in the first epitaxial layer 21 on either side of the gate trench 25. These regions of p-type conductivity silicon carbide 31 have a higher carrier concentration than is present in the second epitaxial layer 22. The regions of p-type conductivity silicon carbide 31A and 31B extend below the bottom surface of the trench 25.

FIG. 6 also illustrates a drain contact 32 which is an ohmic contact formed on the lower surface of substrate 20. A gate contact 36 is formed in the gate trench 25 and ohmic source contacts 38A and 38B are formed on the upper surface of the second epitaxial layer 22 adjacent to the trench 25. The source contacts 38A and 38B are electrically connected. The source contacts 38A and 38B are formed such that they contact both the $n^+$ regions 28 and the p-type conductivity second epitaxial layer 22.

FIG. 7 illustrates an embodiment of the present invention having a plurality of the unit cells of FIG. 5 or 5A. As with FIG. 5 or 5A, the transistor of FIG. 7 includes a bulk single crystal silicon carbide substrate 20 of n-type conductivity silicon carbide. A first epitaxial layer 21 of n-type conductivity silicon carbide is formed on the substrate 20 and a second epitaxial layer 22 of p-type conductivity is formed on the first epitaxial layer 21. The transistor of FIG. 7 is comprised of two of the unit cells of FIG. 5 and a terminating p region.

As seen in FIG. 7, a plurality of gate trenches 25A and 25B are formed. Adjacent to these gate trenches are formed a plurality of p-type conductivity regions 31C, 31D, and 31E which are formed in the first epitaxial layer 21. The p-type region 31E acts as a pattern terminating region to provide symmetry about the gate trench 25B. As will be appreciated by one of skill in the art, any number of the unit cells of FIG. 5 or 5A may be combined to create a transistor according to the present invention. However, it is preferred that each of the gate trenches of the unit cells be adjacent p-type conductivity regions formed in the first epitaxial layer 21 such that a p-type conductivity region is formed on either side of the gate trench.

The transistor of FIG. 7 further includes a plurality of source contacts 38C, 38D, and 38E which are ohmic contacts formed on the upper surface of the second epitaxial layer. The source contacts 38C, 38D, and 38E are electrically connected and are formed so that they contact both the $n^+$ regions 28 formed in the second epitaxial layer 22 and the p-type conductivity regions of the second epitaxial layer 22. Contacts may also be formed in gate trenches 25A and 25B to create gate contacts 36A and 36B. As with the previously described transistors, a drain contact 32 is formed on the lower surface of substrate 20.

Transistors according to the present invention may be formed in any number of geometric shapes. As will be appreciated by those of skill in the art, cell topologies such as linear, square window/square array, circular window/square array, hexagonal window/hexagonal array, hexagonal window/square array and atomic lattice/square array may be utilized.

Fabrication of the devices described above with respect to FIGS. 2 through 7 will now be described. In fabricating the device having a unit cell of FIG. 2, a thick n layer 21 is grown on the n+ substrate 20 utilizing an epitaxial growth process such as that described in the U.S. Pat. No. 4,912,064, the disclosure of which is incorporated herein by reference as if set forth fully. A second p-type epitaxial layer 22 is also epitaxially grown on the first n-type epitaxially layer 21. The n+ regions 23 are then formed on the p-type epitaxial layer 22. These n+ regions 23 may be formed either by epitaxial growth or ion implantation. In the case of epitaxial growth, the regions 23 may be formed as a third epitaxial layer. After creation of the epitaxial structure, the gate trench 25 and the source trench 27 are formed by reactive ion etching through the second and third epitaxial layers 22 and 23 and into the first epitaxial layer 21. The source trench 27 and tile gate trench 25 may be etched utilizing the reactive ion etching techniques described in U.S. Pat. No. 4,981,551, the disclosure of which is incorporated herein by reference as if set forth fully.

After formation of the gate and source trenches 25 and 27, an insulator/oxide layer 26 is formed in the gate trench 25 such that the insulator layer covers the bottom and sidewalls of the trench and extends onto the upper surface of the n+ regions 23. The insulator/oxide layer 26 can preferably utilizes either a thermal oxidation process such as that described in commonly assigned U.S. patent application Ser. No. 08/554,319 entitled "Process For Reducing Defects In Oxide Layers In Silicon Carbide", the disclosure of which is incorporated herein by reference as if set forth fully, or a deposited oxide process such as that described in U.S. Pat. No. 5,459,107 and U.S. patent application Ser. No. 08/554,319, the disclosures of which are incorporated herein by reference as if set forth fully. If the thermal oxidation process is used then tile preferred embodiment is to use carbon faced wafers such as described in U.S. Pat. No. 5,506,421, the disclosure of which is incorporated herein by reference as if set forth fully. After formation of the source trench 27, a deep p+ implanted region is formed in the first epitaxial layer 21 at the bottom of the source trench 27. This p+ implanted region 30 may be formed by a method such as those described in U.S. Pat. No. 5,087,576, the disclosure of which is incorporated herein by reference as if set forth fully.

The gate contact may be formed by depositing a conducting layer in the gate trench 25. After implantation of the p+ region in the first epitaxial layer 21, the source contact may be formed by forming an ohmic contact which extends from the upper surface of the n-type conductivity regions 23 down the sidewalls of the trench 27 and across the bottom of trench 27. The drain contact is formed on the bottom of substrate 20 by forming an ohmic contact with the n+ substrate.

As will be appreciated by those of skill in the art, masking techniques may be utilized to vary the geometry of the trenches formed to create the source trench 27 and the gate trench 25 in the unit cell of FIG. 2 or 2A. Furthermore, masking techniques may be utilized to vary the number of unit cells which make up a device according to the present invention such as those shown in FIGS. 3 and 4.

In fabricating the devices having the unit cell of FIG. 5 or FIG. 5A, again an n+ substrate 20 has an n epitaxial layer 21 formed on its upper surface or alternatively on a buffer layer 24 formed on the upper surface of the substrate 20. The epitaxial layer 21 may be grown using the epitaxial growth techniques described in U.S. Pat. No. 4,912,064 which has been incorporated herein by reference. After growth of the first epitaxial layer 21, the regions of p-type conductivity silicon carbide 31 are formed in the first epitaxial layer 21. These regions may be formed by the ion implantation methods of U.S. Pat. No. 5,087,576. After creation of the implanted regions 31, the second epitaxial layer 22 is grown to create the p-type conductivity epitaxial layer utilizing the methods of U.S. Pat. No. 4,912,064. After creation of the p-type epitaxial layer 22, n+ regions 28 are formed in the p-type epitaxial layer 22 by ion implantation such as that described in U.S. Pat. No. 5,087,576. The ion implantation is selectively done so as to allow a contact point between the p region of the second epitaxial layer 22 and a source contact 38 formed on the upper surface of the second epitaxial layer 22. An alternative p+ region 29 may be formed to provide ohmic contact.

After formation of the n+ regions 28, the gate trench 25 is formed by reactive ion etching through the n region 28 and the p epitaxial layer 22 and into the first epitaxial layer 21. The gate trench 25 may be formed by the reactive ion etching techniques of U.S. Pat. No. 4,981,551. Because the p-type region 31 formed in the first epitaxial layer 21 is formed prior to growth of the second epitaxial layer 22, the gate trench 25 must be registered to the implanted region so that the trench is adjacent to the implanted region and, in the instance of multiple unit cells, between two p-type implanted regions. Furthermore, the n+ regions 28 formed in the second epitaxial layer 22 must also be registered so as to allow for the gate trench 25 to be formed adjacent the p-type region formed in the first epitaxial layer 21.

After forming the gate trench 25, an oxide layer 26 is formed on the upper surface of the second epitaxial layer 22 which extends down the sidewalls of gate trench 25 and across the bottom of gate trench 25. A gate contact 36 may then be formed inside the gate trench 25. A source contact 38 is formed on the upper surface of the second epitaxial layer 22 adjacent the gate trench 25 contacting the n+ source region 28 and, optionally, the p+ region 29 and a drain contact 32 is formed on the lower surface of substrate 20.

As will be appreciated by those of skill in the art, the formation of multiple unit cells to create transistors according to the present invention such as those shown in FIGS. 6 and 7 may be accomplished by carrying out the above steps utilizing a mask designed or other method of selective placement to create the trench configuration and implanted regions required by the particular transistor geometry.

Devices according to the present invention achieve reduced field crowding at the corner of the gate oxide by implantation of the p+ region in the first epitaxial layer 21. The ability to achieve a sufficient reduction in field crowding to move the breakdown location of the device from the corner of the gate oxide to the bulk semiconductor area is affected by the doping, the size and the location of the p+ implanted region 30 or 31. As seen in FIGS. 2, 2A, 5 and 5A the depth of the p+ implanted region 30 or 31 below the upper surface of the first epitaxial layer 21 is designated as h. The width of the p+ implanted region 30 or 31 is designated as w. Two other dimensions which affect the ability of the p+ implanted region to reduce field crowding are the distance between the p+ implanted region 30 or 31 and the gate trench 25 which is shown as the dimension g in FIGS. 2, 2A, 5 and 5A and the distance to which the p+ implanted region extends past the bottom of the gate trench. This dimension is designated as d in FIGS. 2, 2A, 5 and 5A.

With respect to the unit cell of FIG. 2 and 2A, the depth and width of the p+ implanted region 30 will be governed by the width and depth of the source trench 27. Because it is difficult and generally uneconomical to perform deep level implants in silicon carbide, the dimension h, the depth to which the p+ implanted region 30 extends into the first epitaxial layer 21, is governed by the depth to which the source trench 27 extends into the first epitaxial layer 21. Furthermore, the width w of the implanted region 30 is also governed by the width of source trench 27. Because source trench 27 opens the window for implantation to the first epitaxial layer, the location and size of the implanted region 30 will be governed by the location and size of source trench 27. The gap between the implanted region 30 and the gate trench 25 is also specified by the location of source trench 27.

Likewise, with respect to the unit cell of FIGS. 5 and 5A, the depth and width of the implanted region 31 will be specified by a mask during that implanting phase of fabrication. The depth h of the implanted region 31 will be limited to the depth to which implantation is feasible in silicon carbide. The gap g between the implanted region 31 and the gate trench 25 will be limited by the registration ability so as to guarantee that the trench 25 is not formed so as to contact or cut through the implanted region 31. The depth d to which the implanted region 31 extends past the gate trench 25 will also be limited by the ability to implant ions in silicon carbide and the ability to control the depth to which the gate trench 25 is etched.

In practice, for the unit cell of FIGS. 2 or 2A, it is desirable that the source trench 27 and the gate trench 25 be as close together as possible. Accordingly, a gap g of from about 0.3 $\mu$m to about 20 $\mu$m is preferred. However, as higher quality etching and lithographic techniques become available, this gap may be reduced. The depth h and width w of the implanted region which are defined by the width and the depth of the source trench 27 are preferred to be from about 100 Å to about 5 $\mu$m for the depth h and from about 0.1 $\mu$m to about 20 $\mu$m for the width w. The depth d to which the implanted region 30 extends past the bottom of gate trench 25 should be from about 100 Å to about 5 $\mu$m.

With respect to the implanted region 31 of FIGS. 5 and 5A, a depth h for the implanted region must be sufficient to extend the bottom of the implanted region 31 past the bottom of the gate trench 25 which will typically be from about 100 Å to about 5 $\mu$m. The width of the implanted region w should be as narrow as possible but still sufficient to allow the reduction in field crowding achieved through the use of the implanted region 31. Widths of from about 0.1 $\mu$m to about 20 $\mu$m are preferred. As with the unit cell of FIGS. 2 or 2A, the gap g between the implanted region 31 and the gate trench 25 should be as small as possible and will typically be from about 0.3 $\mu$m to about 20 $\mu$m but, as discussed above, will be limited by the ability to register the gate trench to the implanted region 31. The depth d to which the acquired region extends past the bottom of the gate trench 25 should also be from about 100 Å to about 5 $\mu$m.

In each of the embodiments described above, the substrate and epitaxial layers may be formed of silicon carbide selected from the group of 6H, 4H, 15R, or 3C silicon carbide, however, 4H silicon carbide is preferred for each of the devices described above. The preferred metals for ohmic contacts include nickel, tantalum silicide and platinum. Additionally, aluminum/titanium contacts may also be used to form the ohmic contacts of the present invention. While these particular metals have been described, any other metals known to those of skill in the art which form ohmic contacts with silicon carbide may be used.

With regard to the carrier concentrations or doping levels of the epitaxial layers and implanted regions of the devices described above, the p+ or n+ conductivity type regions and epitaxial layers should be as heavily doped as possible without causing excessive fabrication defects. Carrier concentrations of greater than about $5 \times 10^{17}$ cm$^{-3}$ are suitable for these regions and epitaxial layers, however, carrier concentrations of greater than about $1 \times 10^{18}$ cm$^{-3}$ are preferred. Suitable dopants for producing the p-type regions include aluminum, boron or gallium. Suitable dopants for producing the n-type regions include nitrogen and phosphorus. Aluminum is the preferred dopant for the p+ regions and it is preferred that the aluminum be implanted in the p+ regions using high temperature ion implantation such as is described above and employing temperatures of between 1000° C. and 1500° C. Carrier concentrations of up to about $3 \times 10^{17}$ cm$^{-3}$ are suitable for the n epitaxial layers, however, carrier concentrations of about $3 \times 10^{16}$ cm$^{-3}$ or less are preferred. With regard to the p-type epitaxial layer, carrier concentrations of from about $1 \times 10^{16}$ cm$^{-3}$ to about $2 \times 10^{18}$ cm$^{-3}$ are suitable and carrier concentrations from about $5 \times 10^{16}$ cm$^{-3}$ to about $5 \times 10^{17}$ cm$^{-3}$ are preferred. As will be appreciated by one of skill in the art, the doping level of the p+ implanted region must be sufficient to prevent back-depletion of the p region.

As will be appreciated by those of skill in the art, the thickness of epitaxial layers 21 and 22 and the depth of implanted region 28 and the thickness of epitaxial layer 23 will be dependent upon the desired operating characteristics of the device. Furthermore, these operating characteristics will be affected by the number of unit cells employed and the geometry of the unit cells. The width of the gate trench will also be dependent upon the desired operating characteristics of the device, the number of unit cells employed to achieve those operating characteristics, and the geometry utilized for the unit cell itself.

Because depletion of the p-n junction between the drift layer and the p-base layer is shared with the implanted p+ region in the drift layer, the doping level of the p-base layer and/or the thickness of the base layer may be reduced while still preventing back depletion or reach through breakdown. The use of the p+ implanted region of the present invention, therefore, may allow for a device of the present invention to have at least one of a lower carrier concentration or a decreased thickness of the p-base layer over a corresponding silicon carbide device without the p+ implanted regions. The reduction in doping or the decrease in thickness or the combination of the two which may be achieved through use of the teachings of the present invention will reduce the on-state resistance of the silicon carbide transistor and allow transistors of the present invention to more closely approximate the ideal on-state resistance for a silicon carbide UMOSFET. The amount of reduction in thickness or doping is dependent on the desired operating characteristics of the device and may be determined by taking into account the impact of the p+ implanted regions to the depletion of the p-n junction of the base/drift junction. Methods of determining the operating characteristics for a UMOSFET are known to those of skill in the art. See *Baliga Power Semiconductor Devices*, Ch. 7, pp. 335–425.

In operation, the present device functions as described above for a UMOSFET. Thus a conductive path is formed between the n+ source regions 28 and 23 and the n drift region 21 by forming an inversion layer through the p region 22. This inversion layer is formed along the sidewall of the gate trench 25 when a positive voltage is applied to the gate contact 36. In the forward blocking mode, however, when the gate to source voltage is reduced to below the threshold voltage of the FET, increased drain to source voltages can be supported by the device. At these increased voltages, the p+ implanted region 30 or 31 reduces the field crowding at the corner of the gate oxide by diffusing the depletion across the adjacent p+ regions. Thus, the field crowding at the gate oxide corner is reduced and the breakdown of the device in forward blocking mode occurs in the bulk semiconductor rather than at the corner of the gate oxide. This transfer of the breakdown from the gate oxide corner to the bulk semiconductor increases the breakdown voltage and, thereby, increases the forward blocking mode voltage which the device may support.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A silicon carbide metal-insulator semiconductor field effect transistor comprising:
   a u-shaped gate trench;
   an n-type silicon carbide drift layer;
   a p-type silicon carbide base layer formed by epitaxial growth on said n-type silicon carbide drift layer and having a higher carrier concentration than said silicon carbide drift layer; and
   a p-type region formed by ion implantation in said silicon carbide drift layer adjacent to and discontiguous with said u-shaped gate trench and extending to a depth below the bottom of said u-shaped gate trench so as to prevent field crowding at the corner of said gate trench.

2. A silicon carbide metal-insulator semiconductor field effect transistor according to claim 1, wherein said p-type silicon carbide base layer has at least one of the carrier concentration of said silicon carbide base layer and the thickness of said silicon carbide base layer selected to reduce the on-state resistance of said transistor while preventing back depletion of said base layer.

3. A silicon carbide metal-insulator semiconductor field effect transistor according to claim 2 wherein said p-type silicon carbide base layer has a thickness which is less than the thickness required to prevent back depletion in a corresponding silicon carbide field effect transistor which does not have said p-type silicon carbide regions formed in said silicon carbide drift layer.

4. A silicon carbide metal-insulator semiconductor field effect transistor according to claim 1 wherein said p-type silicon carbide base layer has a thickness of less than about 5 $\mu$m.

5. A silicon carbide metal-insulator semiconductor field effect transistor according to claim 1 wherein said p-type silicon carbide base layer has a carrier concentration of less than about $2 \times 10^{18}$ cm$^{-3}$.

6. A unit cell of a metal-insulator semiconductor transistor, said unit cell comprising:
   a bulk single crystal silicon carbide substrate of n-type conductivity silicon carbide, said substrate having an upper surface and a lower surface opposite said upper surface;
   a first epitaxial layer of n-type conductivity silicon carbide formed on said upper surface of said substrate, wherein the carrier concentration of said substrate is higher than the carrier concentration of said first and said second epitaxial layers;
   a second epitaxial layer of p-type conductivity silicon carbide formed on said first epitaxial layer;
   a first trench extending downward through said second epitaxial layer and into said first epitaxial layer, said trench having sidewalls and a bottom;
   a region of n-type conductivity silicon carbide formed in said second epitaxial layer adjacent said first trench and extending to the upper surface of said second epitaxial layer to create a region in said second epitaxial layer having an upper surface of n-type conductivity silicon carbide and wherein said region of n-type conductivity silicon carbide has a higher carrier concentration than said first and said second epitaxial layers;
   an insulator layer formed on said sidewalls and said bottom of said first trench and extending onto said upper surface of said n-type conductivity silicon carbide formed in said second epitaxial layer to create a gate oxide layer, wherein the upper surface of said gate insulator layer formed on the bottom of said first trench is below said second epitaxial layer;
   an ohmic contact formed on said lower surface of said substrate to form a drain contact;
   an ohmic contact formed on said upper surface of said second epitaxial layer and contacting said upper surface of said n-type conductivity region of said second epitaxial layer to form a source contact so as to electrically connect said region of n-type conductivity silicon carbide to said p-type conductivity second epitaxial layer; and
   a region of p-type conductivity silicon carbide formed by ion implantation in said first epitaxial layer below said source contact adjacent to and discontiguous with said first trench, wherein said region of p-type conductivity silicon carbide has a higher carrier concentration than said second epitaxial layer;
   a conductive layer formed in said first trench to form a gate contact.

7. A unit cell of a silicon carbide metal-insulator semiconductor field effect transistor according to claim 6 wherein said second epitaxial layer has a thickness of less than about 5 $\mu$m.

8. A unit cell of a silicon carbide metal-insulator semiconductor field effect transistor according to claim 6 wherein said second epitaxial layer has a carrier concentration of less than about $2 \times 10^{18}$ cm$^{-3}$.

9. A silicon carbide metal-insulator semiconductor transistor comprising a plurality of the unit cells of claim 6.

10. A unit cell of a silicon carbide metal-insulator semiconductor field effect transistor according to claim 6 wherein said insulating layer comprises an oxide layer.

11. A unit cell of a silicon carbide metal-insulator semiconductor field effect transistor according to claim 6 further comprising a second region of p-type conductivity silicon carbide formed in said second epitaxial layer beneath said source contact, said second region of p-type conductivity silicon carbide having a higher carrier concentration than said second epitaxial layer.

12. A unit cell of a silicon carbide metal-insulator semiconductor field effect transistor according to claim 6 wherein said silicon carbide comprises 4H silicon carbide.

13. A unit cell of a silicon carbide metal-insulator semiconductor field effect transistor according to claim 6 further comprising a buffer layer of n-type conductivity silicon carbide formed between said first epitaxial layer and said substrate.

* * * * *

UNITED STATES PATENT AND TRADEMARK OFFICE
CERTIFICATE OF CORRECTION

PATENT NO. : 5,831,288
DATED : November 3, 1998
INVENTOR(S) : Ranbir Singh; John W. Palmour It is certified that error appears in the above-identified patent and that said Letters Patent is hereby corrected as shown below: On the title page, Under [56] References Cited:

Williams, et al. reference should read:
—Williams, et al., A 30-V P-channel Trench Gated DMOSFET with 900 $\mu\Omega\text{-cm}^2$ Specific On-Resistance at 2.7 V, Proceedings of the $8^{th}$ International Symposium on Power Semiconductor Devices and IC's (ISPSD), pp. 53-56 (1996).—

Waldrop, et al. reference should read:
-- Waldrop et al., Formation of Schottky barrier height of metal contacts to β-SiC, *Appl. Phys. Lett.* 56(6) (rn. 5, 1990).—

Bhatnagar, et al. reference should read:
-- Bhatnagar et al., *Comparison of 6H-SiC, 3C-SiC, and Si for Power Devices*, IEEE (1993). --

Signed and Sealed this

Twenty-second Day of June, 1999

Attest:

Q. TODD DICKINSON

*Attesting Officer*    *Acting Commissioner of Patents and Trademarks*